(12) United States Patent
Im

(10) Patent No.: US 8,000,564 B2
(45) Date of Patent: Aug. 16, 2011

(54) PHOTOELECTRIC CONVERSION MODULE FOR DIRECT OPTICAL INTERCONNECTION AND METHOD OF MANUFACTURING THE SAME

(75) Inventor: Young Min Im, Seoul (KR)

(73) Assignee: Korea Electronics Technology Institute (KR)

( * ) Notice: Subject to any disclaimer, the term of this patent is extended or adjusted under 35 U.S.C. 154(b) by 177 days.

(21) Appl. No.: 12/079,507

(22) Filed: Mar. 27, 2008

(65) Prior Publication Data

US 2008/0240648 A1 Oct. 2, 2008

(30) Foreign Application Priority Data

Mar. 30, 2007 (KR) ........................ 10-2007-0031872

(51) Int. Cl.
*G02B 6/12* (2006.01)
*H01L 21/60* (2006.01)

(52) U.S. Cl. ............. 385/14; 385/39; 385/51; 438/106; 438/108; 257/99; 257/E21.511

(58) Field of Classification Search .................... 385/14, 385/24, 32, 39, 51, 52, 88–94; 438/106–108; 257/E21.511, E21.512, E21.513, E21.514, 257/E23.067, E23.075, E23.174, 99; 361/767, 361/783

See application file for complete search history.

(56) References Cited

U.S. PATENT DOCUMENTS

| 4,732,446 | A | * | 3/1988 | Gipson et al. ................... 385/24 |
|---|---|---|---|---|
| 5,468,681 | A | * | 11/1995 | Pasch ............................ 438/108 |
| 5,574,814 | A | * | 11/1996 | Noddings et al. ............... 385/90 |
| 6,330,377 | B1 | * | 12/2001 | Kosemura ....................... 385/14 |
| 6,512,861 | B2 | * | 1/2003 | Chakravorty et al. .......... 385/14 |
| 7,560,371 | B2 | * | 7/2009 | Dando et al. .................. 438/612 |
| 2005/0101699 | A1 | * | 5/2005 | Yan et al. ....................... 523/443 |
| 2006/0045434 | A1 | * | 3/2006 | Numata et al. .................. 385/88 |

* cited by examiner

*Primary Examiner* — Uyen Chau N Le
*Assistant Examiner* — Michael Mooney
(74) *Attorney, Agent, or Firm* — Ober, Kaler, Grimes & Shriver; Royal W. Craig

(57) ABSTRACT

Provided are a photoelectric conversion module for direct optical interconnection and a method of manufacturing the same, wherein an optical element array is bonded to a side surface of an IC board having a semiconductor chip mounted thereon and an optical waveguide array is bonded to one end of the optical element array having the other end bonded to the IC board to be optically connected to the optical element array, thereby improving the efficiency of optical coupling between optical elements and optical waveguides, and wherein since the optical coupling between the optical elements and the optical waveguides is realized on the same plane between the optical waveguides having the same array as the optical elements, multi-channel optical coupling can be facilitated to enable easy implementation of an optical design.

11 Claims, 8 Drawing Sheets

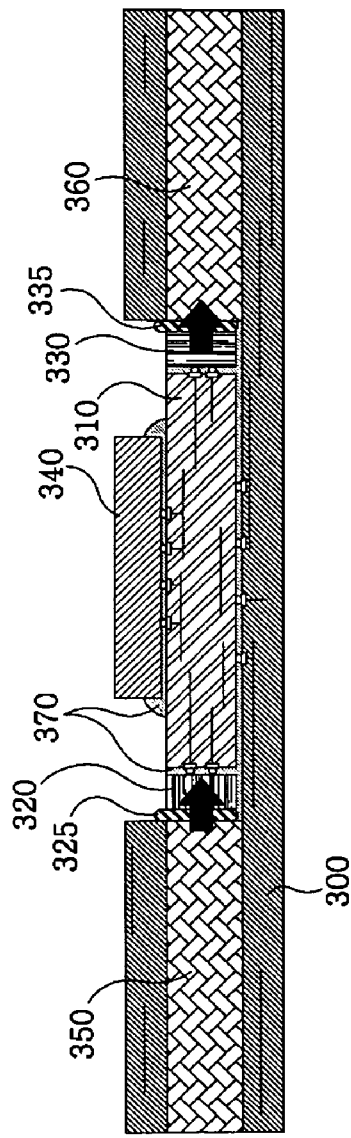
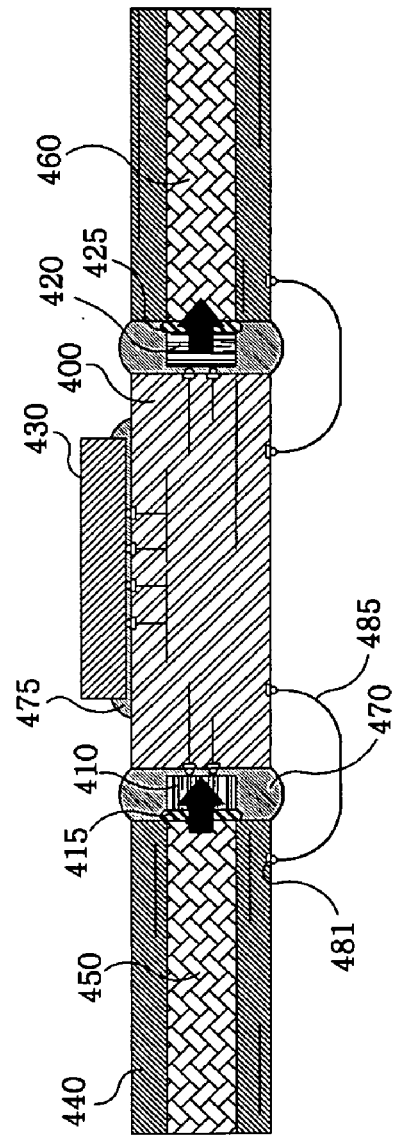
FIG. 4
FIG. 5

PHOTOELECTRIC CONVERSION MODULE FOR DIRECT OPTICAL INTERCONNECTION AND METHOD OF MANUFACTURING THE SAME

CROSS REFERENCE TO RELATED APPLICATION

The present application derives priority from Korean Patent Application No. 10-2007-0031872 filed on Mar. 30, 2007.

BACKGROUND OF THE INVENTION

1. Field of the Invention

The present invention relates to a photoelectric conversion module and a method of manufacturing the same, and more particularly, to a photoelectric conversion module for direct optical interconnection and a method of manufacturing the same.

2. Description of the Related Art

In recent years, information communication technologies have been developed to improve the rate of transferring large amounts of data, along with optical communication technologies for implementing a high-speed communication environment.

Generally, in optical communication systems, the photoelectric conversion element of a transmitter converts electric signals into optical signals and transmits the converted optical signals to a receiver through an optical fiber or an optical waveguide. Then, a photoelectric conversion element of the receiver converts the received optical signals into electric signals.

In order to commercialize an optical communication system using the photoelectric conversion element, it is necessary to realize effective electrical connection and optical coupling.

U.S. Pat. No. 6,512,861 (2003 Jan. 28) to Chakravorty, et al. (Intel Corporation) discloses an optical coupling technique in which an optical element converts electric signals into optical signals in response to a control signal generated by a semiconductor chip and outputs the converted optical signals, and then the optical signals outputted from the optical element are reflected from a 45 degree mirror formed on one side surface of the optical waveguide in a printed circuit board (PCB) to the inside of the optical waveguide.

This structure has a problem in that optical interconnection efficiency is very low due to a gap between the optical element and the optical waveguide.

For example, when VCSEL (vertical cavity surface-emitting laser) is used as the optical element, the VCSEL emits light in the air at an angle of 25 to 30 degrees. Therefore, as the distance between the optical element and the optical waveguide increases, the optical interconnection efficiency decreases.

Further, in the related art, many processes are required to form the 45 degree mirror on the side surface of the optical waveguide, which consequently decreases the product reliability.

SUMMARY OF THE INVENTION

The present invention is directed to a photoelectric conversion module and a method of manufacturing the same that substantially obviate one or more problems due to limitations and disadvantages of the related art.

It is an object to provide a photoelectric conversion module for direct optical interconnection and a method of manufacturing the same, in which the efficiency of optical coupling between optical elements and optical waveguides can be improved.

Additional advantages, aspects, and features of the invention will be set forth in part in the description which follows and in part will become apparent to those having ordinary skill in the art upon examination of the following or may be learned from practice of the invention.

In accordance with the foregoing objects, the present provide is a photoelectric conversion module for direct optical interconnection. In an exemplary embodiment the module includes: an Integrated Circuit (IC) board formed on an upper surface of a printed circuit board (PCB); an optical element array bonded to a side surface of the IC board; an optical waveguide array optically connected to one end of the optical element array having the other end bonded to the IC board; and a semiconductor chip formed on an upper surface of the IC board to operate the optical element array.

The optical element array may be bonded to the side surface of the IC board by a flip chip bonding method or a wire bonding method.

The semiconductor chip may be bonded to the upper surface of the IC board by a flip chip bonding method or a wire bonding method.

The IC board may include a plurality of via holes that pass through the upper surface and the side surface of the IC board and are filled with a conductive material, and the semiconductor chip and the optical element array may be electrically connected to each other by the via holes.

A wiring pattern may be formed along the side surface of the IC board from the upper surface of the IC board, and the semiconductor chip and the optical element array may be electrically connected to each other by the wiring pattern.

Connection pads may be formed on the upper surface of the IC board and the upper surface of the optical element array, and the semiconductor chip and the optical element array may be electrically connected to each other by connecting the connection pads with a bonding wire.

A light transmissive epoxy may be interposed between the optical element array and the optical waveguide array to optically connect the optical element array and the optical waveguide array, and the light transmissive epoxy may have a refractive index of about 1.4 to about 1.6 and about 80 to about 95% transmittance for the wavelength of light emitted from the optical elements.

The optical element array may include M×N (where M and N are integral numbers) light emitting elements or light receiving elements.

The optical waveguide array may include M×N optical waveguides, and the optical waveguides may be optically connected to optical elements of the optical element array in one-to-one correspondence with the optical elements.

Epoxy may be filled between the printed circuit board and the IC board, between the IC board and the semiconductor chip, and between the IC board and the optical element array.

In another embodiment there is provide a photoelectric conversion module for direct optical interconnection, the module including: an IC board mounted in a mounting groove of a printed circuit board (PCB); an optical element array bonded to a side surface of the IC board; an optical waveguide array optically connected to one end of the optical element array having the other end bonded to the IC board; and a semiconductor chip formed on an upper surface of the IC board to operate the optical element array. The optical waveguide array is embedded in the printed circuit board.

In yet another embodiment there is provide a photoelectric conversion module for direct optical interconnection, the module including: first and second optical element arrays bonded to both sides of an IC board; a first optical waveguide array optically connected to one end of the first optical element array having the other end bonded to the IC board; a second optical waveguide array optically connected to one end of the second optical element array having the other end bonded to the IC board; and a semiconductor chip formed on an upper surface of the IC board to operate the first optical element array and second optical element array. The first optical waveguide array and the second optical waveguide array are embedded in the printed circuit board, and a space passing through the printed circuit board is formed in a predetermined area of the printed circuit board. The IC board is positioned in the space.

The photoelectric conversion module for direct optical interconnection may further include a protective resin formed between the IC board and the printed circuit board so as to cover the first optical element array and the second optical element array.

The IC board may include a plurality of via holes that pass through the upper surface and the side surfaces of the IC board and are filled with a conductive material, and the semiconductor chip may be electrically connected to the first and second optical element arrays by the via holes.

A wiring pattern may be formed along the side surfaces of the IC board from the upper surface of the IC board, and the semiconductor chip may be electrically connected to the first and second optical element arrays by the wiring pattern.

Connection pads may be formed on the upper surface of the IC board and the upper surfaces of the first and second optical element arrays, and the semiconductor chip may be electrically connected to the first and second optical element arrays by connecting the connection pads with bonding wires.

According to another aspect of the invention, there is provided a method of manufacturing a photoelectric conversion module for direct optical interconnection, the method including: bonding a semiconductor chip to an upper surface of an IC board; bonding an optical element array to a side surface of the IC board; bonding an optical waveguide array to one end of the optical element array having the other end bonded to the IC board such that the optical waveguide array is optically connected to the optical element array; and bonding the IC board to an upper surface of a printed circuit board. A light transmissive epoxy is interposed between the optical element array and the optical waveguide array to bond the optical element array and the optical waveguide array.

Alternatively, the method of manufacturing a photoelectric conversion module for direct optical interconnection may include: bonding a semiconductor chip to an upper surface of an IC board; bonding first and second optical element arrays to both sides of the IC board; forming a mounting groove for the IC board in a printed circuit board having first and second optical waveguide arrays embedded therein; and mounting the IC board in the mounting groove of the printed circuit board, and bonding the first and second optical element arrays to the first and second optical waveguide arrays, respectively, such that they are optically connected to each other.

Alternatively, the method of manufacturing a photoelectric conversion module for direct optical interconnection may include: bonding a semiconductor chip to an upper surface of an IC board; bonding first and second optical element arrays to both sides of the IC board; forming a space in a printed circuit board having first and second optical waveguide arrays embedded therein so as to pass through the printed circuit board; positioning the IC board in the space of the printed circuit board, and bonding the first and second optical element arrays to the first and second optical waveguide arrays, respectively, such that they are optically connected to each other; forming a protective resin between the printed circuit board and the IC board so as to cover the first optical element array and the second optical element array; and electrically connecting the IC board and the printed circuit board with bonding wires.

BRIEF DESCRIPTION OF THE DRAWINGS

Other objects, features, and advantages of the present invention will become more apparent from the following detailed description of the preferred embodiment and certain modifications thereof, in which:

FIG. 4 is a cross-sectional view illustrating a photoelectric conversion module for direct optical interconnection according to a second embodiment of the present invention;

FIG. 5 is a cross-sectional view illustrating a photoelectric conversion module for direct optical interconnection according to a third embodiment of the present invention;

DETAILED DESCRIPTION OF THE EXEMPLARY EMBODIMENTS

Figure 1:
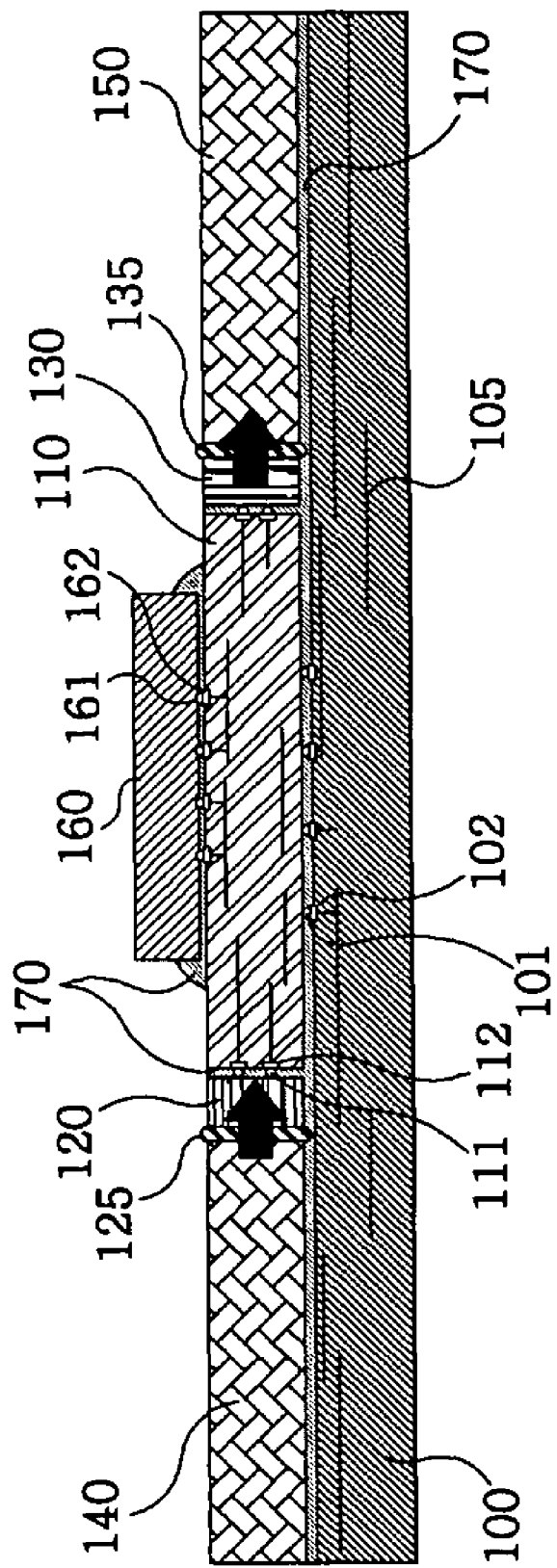
FIG. 1 is a cross-sectional view illustrating a photoelectric conversion module for direct optical interconnection according to a first embodiment of the present invention.

Reference will now be made in detail to the exemplary embodiments of the present invention, examples of which are illustrated in the accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art. Wherever possible, the same reference numerals will be used throughout the drawings to refer to the same or like parts.

Referring to FIG. 1, a photoelectric conversion module for direct optical interconnection according to a first embodiment of the invention includes a printed circuit board 100, an IC board 110, a first optical element array 120, a first light transmissive epoxy 125, a second optical element array 130, a second light transmissive epoxy 135, a first optical waveguide array 140, a second optical waveguide array 150, and a semiconductor chip 160.

As the printed circuit board 100, any of the following may be used: a single-sided printed circuit board having wiring lines on one surface of an insulating substrate; a double-sided printed circuit board having wiring lines on both surfaces; and a multi-layered printed circuit board (MLB) having multiple wiring layers. In recent years, the multi-layered printed circuit boards have been generally used with increasing demands for circuits having high density and a small size.

The multi-layered printed circuit board includes an additional layer for wiring in order to expand a wiring area. Specifically, the multi-layered printed circuit board is divided into an inner layer and an outer layer. A circuit pattern 105, such as a power supply circuit, a ground circuit, and a signal circuit, is formed on the inner layer, and an insulating layer is formed between the inner layer and the outer layer. In this case, wiring lines on the layers are electrically connected to each other by via holes.

The IC board 110 is bonded to an upper surface of the printed circuit board 100. The IC board 110 is bonded to the printed circuit board 100 by a flip chip bonding method using solder balls 101 and bumps 102. The bumps 102 are electrically connected to the circuit pattern 105 that is formed on the inner layer of the printed circuit board 100.

The IC board 110 may be bonded to the printed circuit board 100 by a wire bonding method as well as the flip chip bonding method, or the bonding therebetween may be made by a combination of the flip chip bonding method and the wire bonding method.

The IC board 110 is used as an intermediate medium to facilitate electrical connection between the semiconductor chip 160 and the printed circuit board 100.

That is, the semiconductor chip 160 includes a large number of electrodes arranged at an interval of about several tens of micrometers. Therefore, when the semiconductor chip 160 is directly bonded to the printed circuit board 100, the structure of the printed circuit board 100 becomes complicated, and a lot of costs are required. In the invention, in order to solve this problem, the IC board 110 is interposed between the semiconductor chip 160 and the printed circuit board 100 to electrically connect the semiconductor chip 160 and the printed circuit board 100.

The first optical element array 120 and the second optical element array 130 are bonded to both sides of the IC board 110. The first optical element array 120 and the second optical element array 130 are bonded to the IC board 110 by the flip chip bonding method using the solder balls 111 and the bumps 112.

The first optical element array 120 and the second optical element array 130 may be bonded to the IC board 110 by a wire bonding method as well as the flip chip bonding method, or the bonding therebetween may be made by a combination of the flip chip bonding method and the wire bonding method.

The first optical element array 120 and the second optical element array 130 are driven under the control of the semiconductor chip 160 to convert electric signals into optical signals or optical signals into electric signals.

The reason why the first optical element array 120 and the second optical element array 130 are bonded to both sides of the IC board 110 is to butt-couple the first optical element array 120 and the second optical element array 130 to the first optical waveguide array 140 and the second optical waveguide array 150, respectively.

Each of the first optical element array 120 and the second optical element array 130 includes M×N (where M and N are integral numbers) light receiving elements or light emitting elements, for example, optical elements, such as VCSELs (vertical cavity surface emitting lasers), LEDs (light emitting diodes), and PDs (photo diodes), which are arranged on the same plane.

The first optical waveguide array 140 includes M×N optical waveguides arranged on the same plane. In this case, the optical waveguides of the first optical waveguide array 140 are arranged in the same array as that in which the optical elements of the first optical element array 120 are arranged.

The first optical waveguide array 140 is bonded to the first optical element array 120 by the first light transmissive epoxy 125. In this case, the optical waveguides of the first optical waveguide array 140 are bonded to the corresponding optical elements of the first optical element array 120.

The first light transmissive epoxy 125 has a refractive index that is similar to that of the optical waveguides of the first optical waveguide array 140, and it is preferable to use polymer epoxy that has high light transmittance for the wavelength of light used in the first optical element array 120.

For example, preferably, the first light transmissive epoxy 125 has a refractive index of about 1.4 to about 1.6 and about 80 to about 95% transmittance for the wavelength of light emitted from the first optical element array 120.

The second optical waveguide array 150 includes M×N optical waveguides arranged on the same plane. In this regard, the optical waveguides of the second optical waveguide array 150 are arranged in the same array as that in which the optical elements of the second optical element array 130 are arranged.

The second optical waveguide array 150 is bonded to the second optical element array 130 by the second light transmissive epoxy 135. In this case, the optical waveguides of the second optical waveguide array 150 are bonded to the corresponding optical elements of the second optical element array 130.

Preferably, the second light transmissive epoxy 135 has a refractive index of about 1.4 to about 1.6 and about 80 to about 95% transmittance for the wavelength of light emitted from the second optical element array 130.

Meanwhile, the optical coupling between the optical element array and the optical waveguide array is not necessarily made by the light transmissive epoxy, but it may be made by a general optical coupling packaging technique using an auxiliary sleeve as long as the optical coupling efficiency is not lowered.

In this case, in order to prevent the optical coupling efficiency from being lowered, a distance between the optical element array and the optical waveguide array should be maintained within several tens of micrometers.

The semiconductor chip 160 generates control signals to operate the first optical element array 120 and the second optical element array 130. That is, the semiconductor chip 160 is provided with a circuit for operating the first optical element array 120 and the second optical element array 130.

The semiconductor chip 160 is bonded to the upper surface of the IC board 110 by solder balls 161 and bumps 162. The bonding between the semiconductor chip 160 and the IC board 110 may be made by a wire bonding method as well as the flip chip bonding method. Alternatively, the bonding may be made by a combination of the flip chip bonding method and the wire bonding method.

An epoxy 170 is filled between the printed circuit board 100 and the IC board 110, between the IC board 110 and the semiconductor chip 160, and between the IC board 110 and the first and second optical element arrays 120 and 130.

The epoxy 170 reduces stress generated due to the difference in thermal expansion coefficient between parts when outside temperature varies, and maintains the bonding between the parts.

Further, in this embodiment of the invention, a protective resin (not shown) may be further provided on the upper surface of the IC board 110 so as to cover the semiconductor chip 160, in order to protect the semiconductor chip 160 from an external environment.

As such, in this embodiment of the invention, the first optical element array 120 and the second optical element array 130 are bonded to both sides of the IC board 110 to enable direct optical coupling between the first optical element array 120 and the first optical waveguide array 140 and direct optical coupling between the second optical element array 130 and the second optical waveguide array 150. This structure makes it possible to improve the optical coupling efficiency between the optical elements and the optical waveguides.

That is, in this embodiment of the invention, the distance between the optical element and the optical waveguide can be maintained within several tens of micrometers. Therefore, it is possible to further improve the optical coupling efficiency, as compared to the existing optical coupling technique.

Further, in this embodiment, the light transmissive epoxy, which has a refractive index similar to that of the optical waveguide and high light transmissive for the wavelength of light used in the optical element array, is interposed between the optical element array and the optical waveguide array. Therefore, it is possible to further improve the optical coupling efficiency.

Furthermore, in this embodiment of the invention, the optical couplings between the optical element arrays and the optical waveguide arrays are made on the same plane between the optical waveguides having the same array as the optical elements. Therefore, it is possible to facilitate multi-channel optical coupling to enable easy implementation of an optical design.

Figure 2:
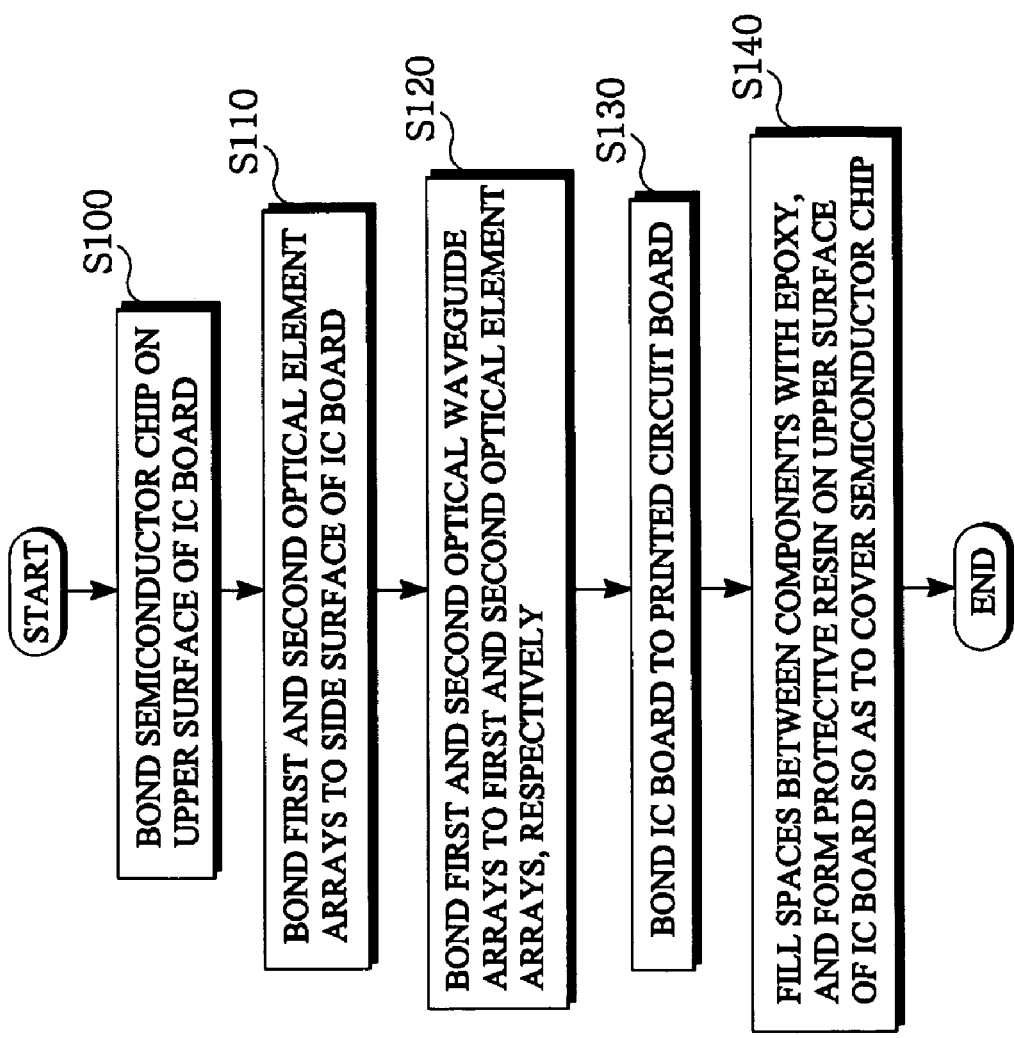
FIG. 2 is a flowchart illustrating a method of manufacturing the photoelectric conversion module for direct optical interconnection according to the first embodiment of the present invention.

Referring to FIGS. 1 and 2, in a method of manufacturing the photoelectric conversion module for direct optical interconnection according to the first embodiment of the invention, first, the semiconductor chip 160 is bonded to the upper surface of the IC board 110 (S100).

In this case, the bonding of the semiconductor chip 160 is performed by a flip chip bonding method using solder balls and bumps or a wire bonding method using bonding wires.

Then, the first optical element array 120 and the second optical element array 130 are bonded to both sides of the IC board 110 (S110).

The first optical element array 120 and the second optical element array 130 each include M×N light receiving elements or light emitting elements arranged on the same plane, and are bonded to both sides of the IC board 110 by the flip chip bonding method or the wire bonding method.

Then, the first optical waveguide array 140 and the second optical waveguide array 150 are bonded to surfaces of the first optical element array 120 and the second optical element array 130 opposite to the surfaces thereof bonded to the IC board 110, respectively (S120).

The first optical waveguide array 140 and the second optical waveguide array 150 each include M×N optical waveguides arranged on the same plane, and the optical waveguides are bonded to the corresponding optical elements of the first optical element array 120 and the second optical element array 130.

That is, a test voltage is applied to the first optical element array 120 and the second optical element array 130 through copper wiring lines formed on the IC board 110 to operate the first optical element array 120 and the second optical element array 130. Then, optical alignment is performed to optically couple the optical elements and the optical waveguides.

The first optical waveguide array 140 and the second optical waveguide array 150 are bonded to the first optical element array 120 and the second optical element array 130 by the first light transmissive epoxy 125 and the second light transmissive epoxy 135, respectively. In this way, optical couplings are made therebetween.

Then, the IC board 110 is bonded to the upper surface of the printed circuit board 100 by the flip chip bonding method or the wire bonding method (S130).

Subsequently, the epoxy 170 is filled between the printed circuit board 100 and the IC board 110, between the IC board 110 and the semiconductor chip 160, between the IC board 110 and the first and second optical element arrays 120 and 130. Then, a protective resin (not shown) is formed on the upper surface of the IC board 110 so as to cover the semiconductor chip 160 (S140).

Meanwhile, this embodiment of the invention may be manufactured by various manufacturing methods as well as the above-mentioned method. For example, the following method may be used: a semiconductor chip is bonded to an upper surface of an IC board; a first optical element array and a second optical element array are bonded to both sides of the IC board; the IC board is bonded to an upper surface of a printed circuit board; a test voltage is applied to the first optical element array and the second optical element array through copper wiring lines formed on the printed circuit board to operate the first optical element array and the second optical element array; optical alignment is performed to optically couple optical elements of the first and second optical element arrays to optical waveguides of the first and second optical waveguide arrays.

Figure 3:
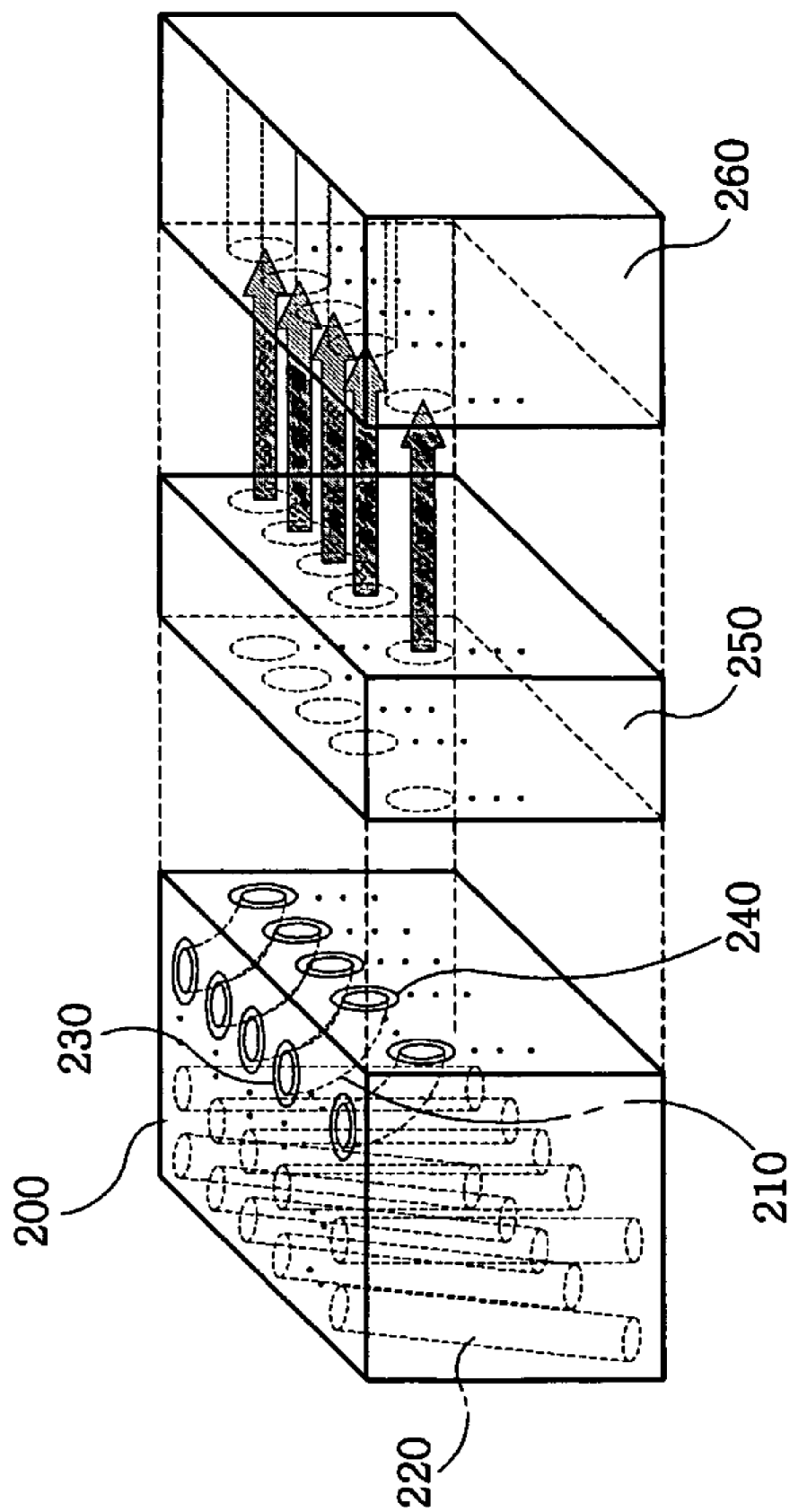
FIG. 3 is a perspective diagram illustrating electrical connection between an IC board and an optical element array according to the first embodiment of the present invention.

The coupling between the IC board and the optical element arrays will be described below with reference to FIG. 3.

That is, a plurality of first via holes 210 are formed in the IC board 200 so as to pass through the upper surface and one side surface of the IC board 200. In addition, a plurality of second via holes 220 are formed in the IC board 200 so as to pass through the upper surface and the lower surface of the IC board 200. The first via holes 210 and the second via holes 220 are filled with a conductive material.

Electrical connection pads 230 formed on the upper surface of the IC board 200 and electrical connection pads 240 formed on the one side surface of the IC board 200 are electrically connected to each other by the first via holes 210 filled with the conductive material.

The electrical connection pads 240 formed on the one side surface of the IC board 200 are bonded to an optical element array 250 by solder balls (not shown) and bumps (not shown). A semiconductor chip (not shown) formed on the upper surface of the IC board 200 and the optical element array 250 bonded to the side surface of the IC board 200 are electrically connected to each other by the first via holes 210 filled with the conductive material.

Further, a semiconductor chip (not shown) formed on the upper surface of the IC board 200 is electrically connected to a printed circuit board (not shown) formed on the lower surface of the IC board 200 by the second via holes 220 filled with the conductive material.

In this way, the optical element array 250 may be connected to the side surface of the IC board 200 by the first via holes 210 filled with the conductive material, and the optical element array 250 can be connected to an optical waveguide array 260 on the same plane.

Meanwhile, the semiconductor chip (not shown) may be electrically connected to the optical element array 250 by various connection methods, such as a connection method using an internal copper wiring circuit and via holes, a connection method using external copper wires, and a connection method using external wires, as well as the connection method using the first via holes 210 filled with the conductive material.

For example, the semiconductor chip (not shown) may be electrically connected to the optical element array 250 by an external copper wiring pattern that is formed along the side surface of the IC board 200 from the upper surface of the IC board 200.

Further, a bonding wire method may be used in which connection pads are formed on the upper surface of the IC board 200 and the upper surface of the optical element array 250 and then connected to each other by wires.

Furthermore, copper wiring circuits and via holes may be formed in the IC board 200 and the optical element array 250 to electrically connect the IC board 200 and the optical element array 250.

Referring to FIG. 4, a photoelectric conversion module for direct optical interconnection according to a second embodiment of the invention is configured as follows.

That is, a portion of the upper surface of a printed circuit board 300 is removed to form a mounting groove, and an IC board 310 is bonded to the mounting groove. Then, a first optical element array 320 and a second optical element array 330 are bonded to both sides of the IC board 310.

Then, a semiconductor chip 340 for operating the first optical element array 320 and the second optical element array 330 is bonded to an upper surface of the IC board 310.

A first optical waveguide array 350 is bonded to the first optical element array 320 by a first light transmissive epoxy 325, and a second optical waveguide array 360 is bonded to the second optical element array 330 by a second light transmissive epoxy 335.

The first optical waveguide array 350 and the second optical waveguide array 360 are embedded in the printed circuit board 300.

Meanwhile, an epoxy 370 is filled between the printed circuit board 300 and the IC board 310, between the IC board 310 and the semiconductor chip 340, and between the IC board 310 and the first and second optical element arrays 320 and 330.

Figure 6:
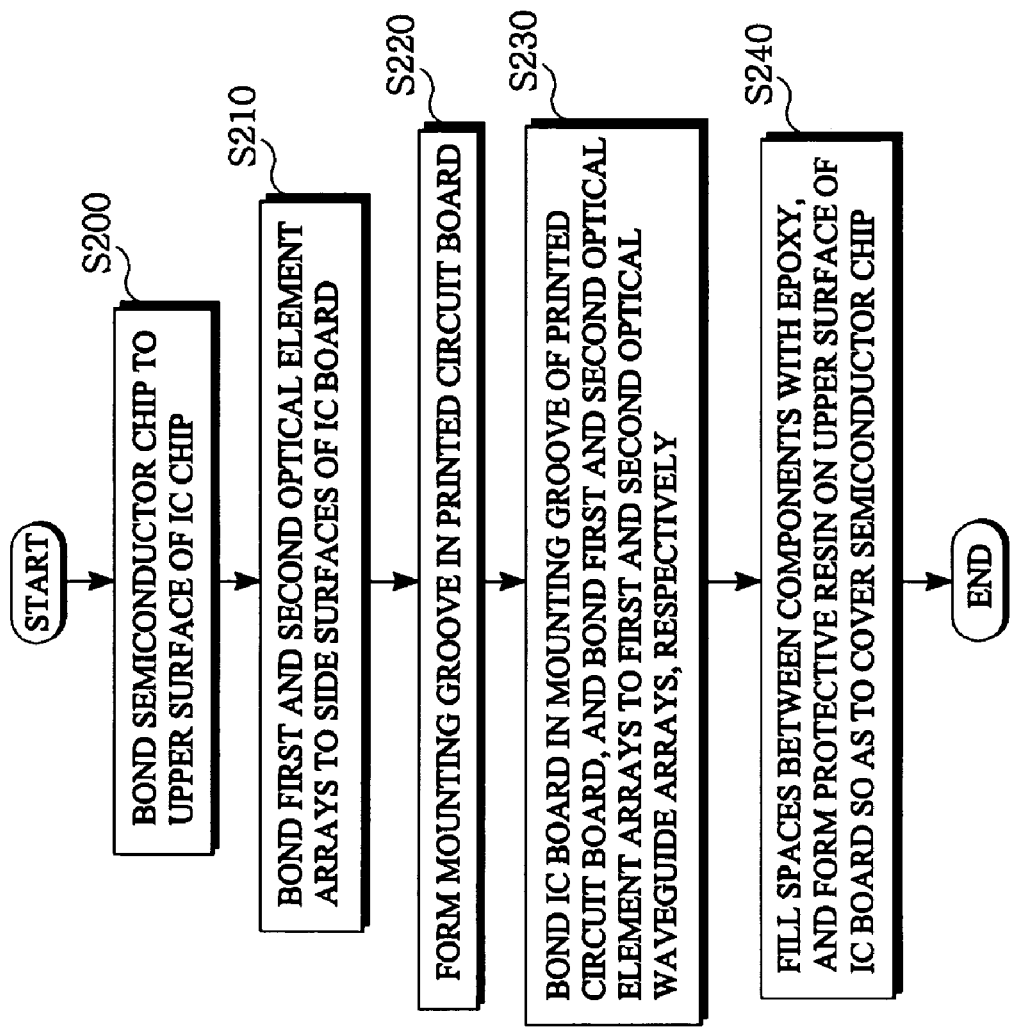
FIG. 6 is a flowchart illustrating a method of manufacturing the photoelectric conversion module for direct optical interconnection according to the second embodiment of the present invention.

Next, a method of manufacturing the photoelectric conversion module for direct optical interconnection according to the second embodiment of the invention will be described with reference to FIGS. 4 and 6. First, the semiconductor chip 340 is bonded to the upper surface of the IC board 310 (S200).

Then, the first optical element array 320 and the second optical element array 330 are bonded to both sides of the IC board 310 (S210).

Then, a mounting groove for the IC board 310 is formed in the printed circuit board 300 having the first optical waveguide array 350 and the second optical waveguide array 360 embedded therein (S220).

In this case, the depth of the mounting groove is adjusted such that, when the IC board 310 is mounted in the mounting groove, the first optical element array 320 and the second optical element array 330 are optically connected to the first optical waveguide array 350 and the second optical waveguide array 360, respectively.

Then, the IC board 310 is electrically connected to the mounting groove of the printed circuit board 300 by solder balls and bumps. Subsequently, the first optical element array 320 and the second optical element array 330 are bonded to the first optical waveguide array 350 and the second optical waveguide array 360, respectively (S230).

In this case, the first light transmissive epoxy 325 and the second light transmissive epoxy 335 are filled between the first optical element array 320 and the first optical waveguide array 350 and between the second optical element array 330 and the second optical waveguide array 360, respectively, thereby bonding the arrays.

Then, the epoxy 370 is filled between the printed circuit board 300 and the IC board 310, between the IC board 310 and the semiconductor chip 340, and between the IC board 310 and the first and second optical element arrays 320 and 330. Subsequently, a protective resin (not shown) is formed on the upper surface of the IC board 310 so as to cover the semiconductor chip 340 (S240).

Referring to FIG. 5, a photoelectric conversion module for direct optical interconnection according to a third embodiment of the invention is configured as follows.

That is, a first optical element array 410 and a second optical element array 420 are bonded to both sides of an IC board 400, and a semiconductor chip 430 for operating the first optical element array 410 and the second optical element array 420 is bonded to an upper surface of the IC board 400.

Then, a first optical waveguide array 450 embedded in a printed circuit board 440 is bonded to the first optical element array 410 by a first light transmissive epoxy 415, and a second optical waveguide array 460 embedded in the printed circuit board 440 is bonded to the second optical element array 420 by a second light transmissive epoxy 425.

In this structure, a space is formed in a central area of the printed circuit board 440 so as to pass through the printed circuit board 440, and the IC board 400 is positioned in the space of the printed circuit board 440.

Further, a protective resin 470 is filled between the IC board 400 and the printed circuit board 440. The protective resin 470 protects the first optical element array 410 and the second optical element array 420, and connects the IC board 400 and the printed circuit board 440.

The printed circuit board 440 and the IC board 400 are electrically connected to each other by bonding a bonding wire 485 to connection pads 481 formed on the lower surfaces of the printed circuit board 440 and the IC board 400.

Figure 7:
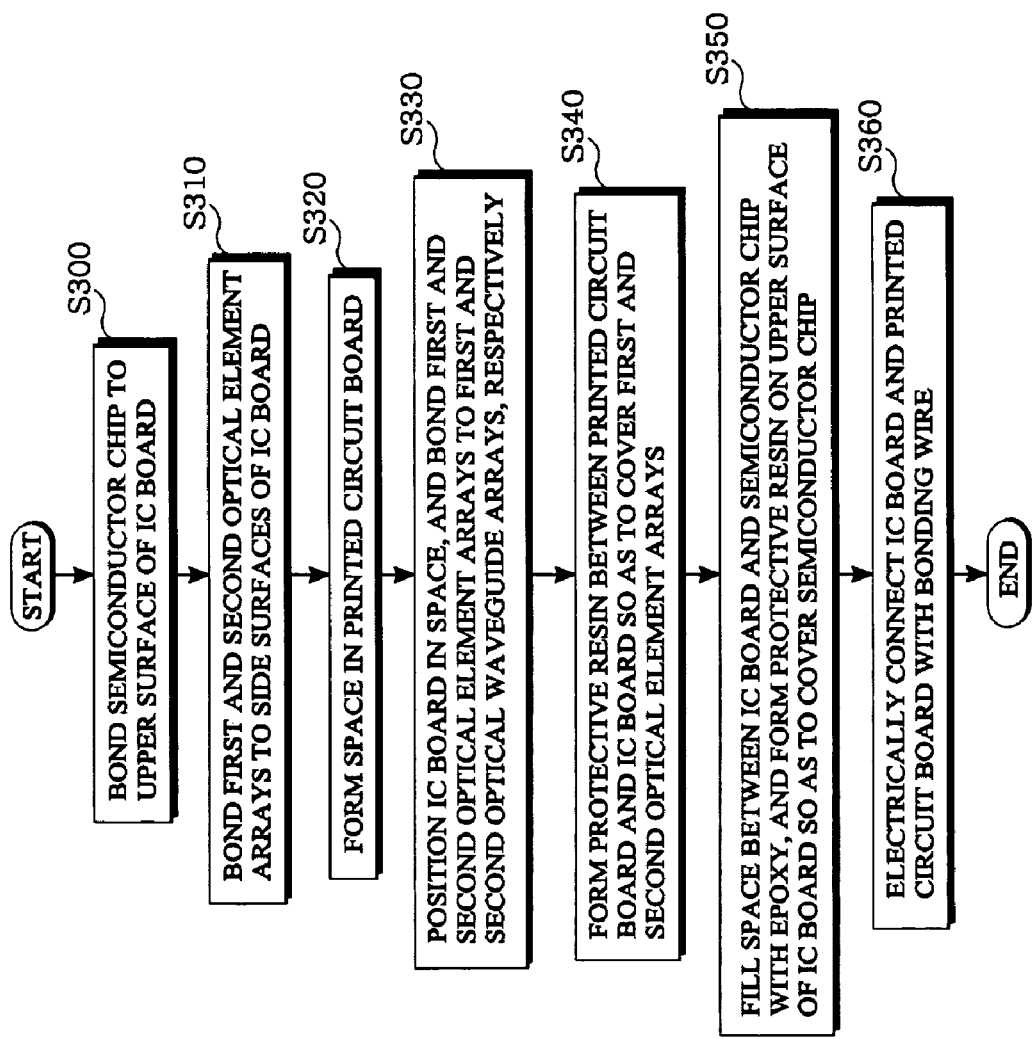
FIG. 7 is a flowchart illustrating a method of manufacturing the photoelectric conversion module for direct optical interconnection according to the third embodiment of the present invention.

Next, a method of manufacturing the photoelectric conversion module for direct optical interconnection according to the third embodiment of the invention will be described with reference to FIGS. 5 and 7. First, the semiconductor chip 430 is bonded to the upper surface of the IC board 400 (S300).

Then, the first optical element array 410 and the second optical element array 420 are bonded to both sides of the IC board 400 (S310).

Then, a space for the IC board 400 is formed in the printed circuit board 440 having the first optical waveguide array 450 and the second optical waveguide array 460 embedded therein (S320).

Subsequently, the IC board 400 is positioned in the space, and the first optical element array 410 and the second optical element array 420 are bonded to the first optical waveguide array 450 and the second optical waveguide array 460, respectively (S330).

That is, a jig is used to fix the IC board 400 in the space of the printed circuit board 440. Then, the first light transmissive epoxy 415 is interposed between the first optical element array 410 and the first optical waveguide array 450 to bond the first optical element array 410 and the first optical waveguide array 450. In addition, the second light transmissive epoxy 425 is interposed between the second optical element array 420 and the second optical waveguide array 460 to bond the second optical element array 420 and the second optical waveguide array 460.

Then, a test voltage is applied to the connection pads formed on the IC board 400 to operate the optical elements. Thereafter, active optical alignment is used to arrange the optical elements and the optical waveguides such that the optical elements are in one-to-one correspondence with the optical waveguides.

Then, a protective resin 470 is formed between the printed circuit board 440 and the IC board 400 so as to cover the first optical element array 410 and the second optical element array 420 (S340).

Subsequently, the epoxy 475 is filled between the IC board 400 and the semiconductor chip 430, and a protective resin (not shown) is formed on the upper surface of the IC board 400 so as to cover the semiconductor chip 430 (S350).

Then, the bonding wire 485 is bonded to the connection pads 481 that are formed on the lower surfaces of the IC board 400 and the printed circuit board 440 to electrically connect the IC board 400 and the printed circuit board 440 (S360).

Figure 8:
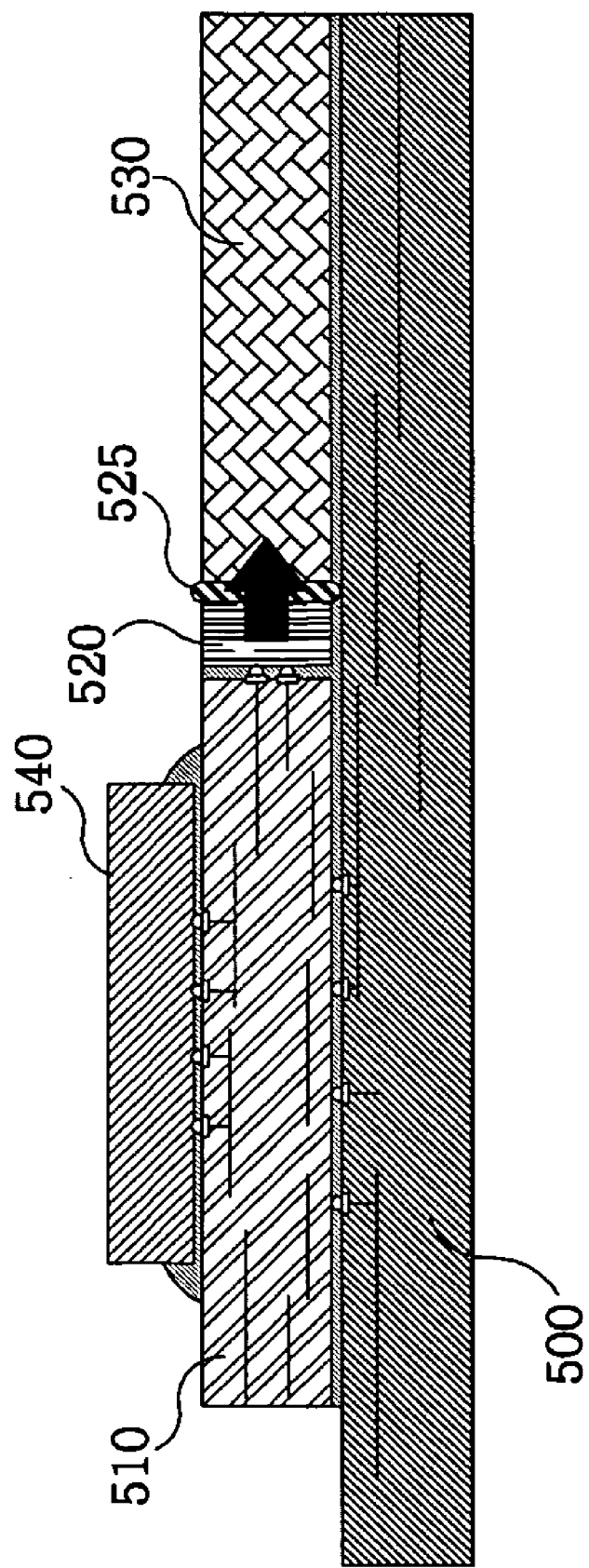
FIG. 8 is a cross-sectional view illustrating a photoelectric conversion module for direct optical interconnection according to a fourth embodiment of the present invention.

Referring to FIG. 8, a photoelectric conversion module for direct optical interconnection according to a fourth embodiment of the invention is configured as follows.

That is, an IC board 510 is bonded to an upper surface of a printed circuit board 500, and an optical element array 520 is bonded to one side surface of the IC board 510.

In addition, an optical waveguide array 530 is bonded to the optical element array 520 by a light transmissive epoxy 525, and a semiconductor chip 540 for operating the optical element array 520 is bonded to an upper surface of the IC board 510.

In this embodiment, the optical element array is bonded to only one side surface of the IC board. This structure may be applied to the above-described embodiments.

Various electric/electronic circuit systems formed on the printed circuit board are configured in various forms at the request of the user, and memories and logic circuit chips are arranged in various patterns on the printed circuit board in plan view.

The photoelectric conversion module for direct optical interconnection according to this embodiment can be connected to another photoelectric conversion module through an optical waveguide on the printed circuit board, and it is possible to easily adjust the gap between the photoelectric conversion modules by adjusting the length of the optical waveguide connecting them.

Next, an electric-optical package using the photoelectric conversion module for direct optical interconnection according to the above-described embodiments of the invention will be described with reference to FIG. 9.

Figure 9:
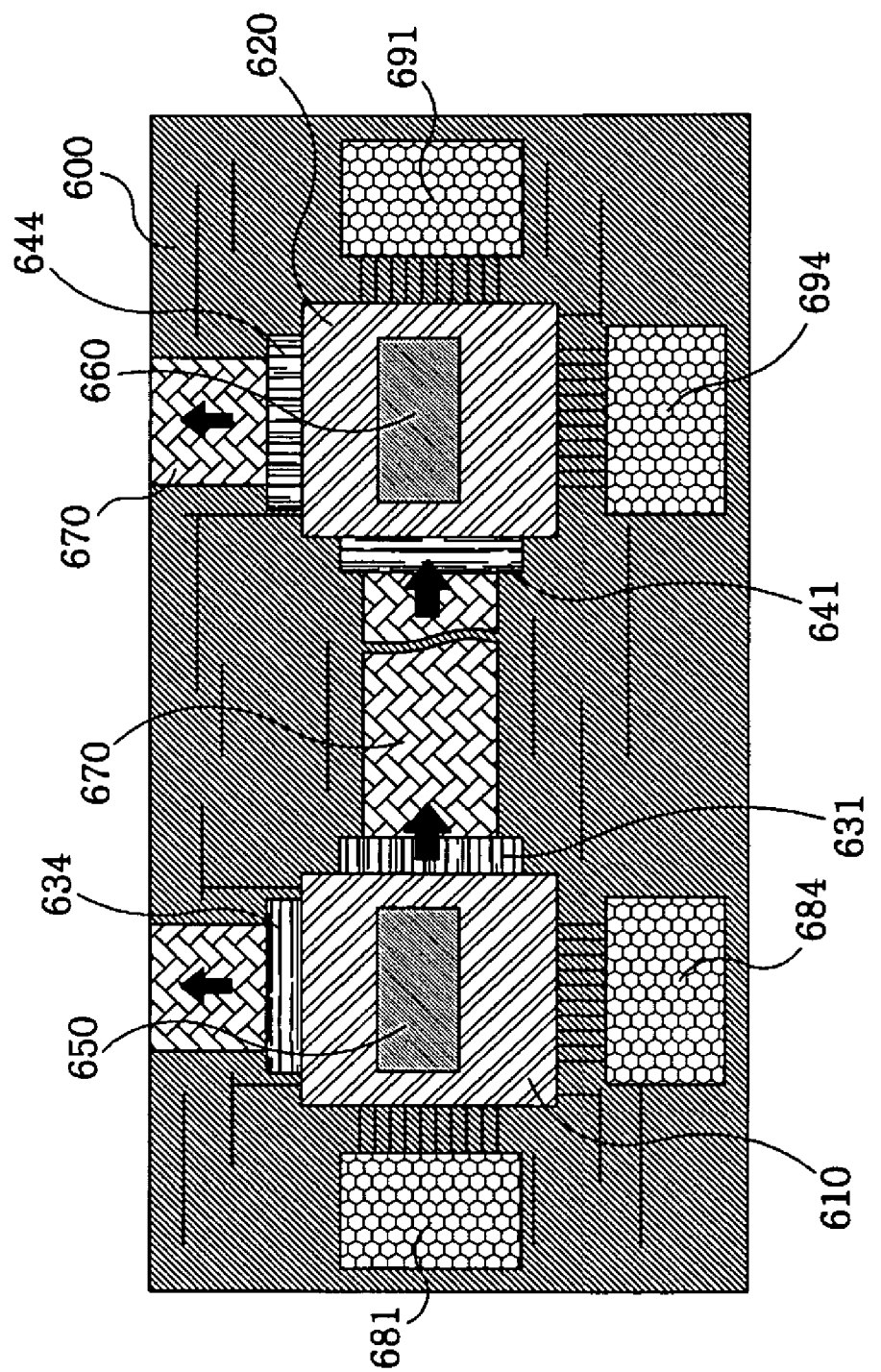
FIG. 9 is a plan view illustrating an embodiment of an electric-optical package using the photoelectric conversion module for direct optical interconnection according to the present invention.

As shown in FIG. 9, a first IC board 610 and a second IC board 620 are formed on a printed circuit board 600 such that they are spaced from each other. Optical element arrays 631 and 634 are bonded to side surfaces of the first IC board 610, and optical element arrays 641 and 644 are bonded to side surfaces of the second IC board 620.

A first semiconductor chip 650 for operating the optical element arrays 631 and 634 is formed an upper surface of the first IC board 610, and a second semiconductor chip 660 for operating the optical element arrays 641 and 644 is formed on an upper surface of the second IC board 620.

In addition, optical waveguide arrays 670 are formed between the corresponding optical element arrays 631, 634, 641, and 644 on the printed circuit board 600.

Meanwhile, the electric-optical package formed on the printed circuit board may be operatively associated with LSIs (large scale integrated circuits). In this case, first and second LSIs 681 and 684 electrically connected to the first IC board 610, and third and fourth LSIs 691 and 694 electrically connected to the second IC board 620 are further provided on the printed circuit board 600.

Electric signals from the first LSI 681 are transmitted to the first semiconductor chip 650 through the first IC board 610 on the printed circuit board 600. The optical element array 631 converts the electric signals into optical signals in response to the control signals from the first semiconductor chip 650, and outputs the converted optical signals. The output optical signals are transmitted to the optical element array 641 through the optical waveguide array 670. When the optical signals are transmitted to the optical element array 641, the optical element array 641 converts the received optical signals into electric signals under the control of the second semiconductor chip 660. Then, the converted electric signals are transmitted to the third LSI 691 through the second IC board 620.

Meanwhile, the electric signals outputted from the second LSI 684 of the first IC board 610 may be transmitted to another LSI through the optical element array 634 and the optical waveguide array 670. The electric signals outputted from the fourth LSI 694 of the second IC board 620 may be transmitted to another LSI through the optical element array 644 and the optical waveguide array 670.

That is, two LSIs can be electrically connected to each of the first IC board 610 and the second IC board 620, and each of the first IC board 610 and the second IC board 620 can transmit the electric signals and the optical signals in two directions.

In this embodiment, optical transmission in one direction has been described for easy understanding, but the invention can be applied to optical transmission in two directions according to the purpose of use of the system. In this case, the optical element arrays 631, 634, 641, and 644 may be formed together with transmitting and receiving elements such that they can transmit or receive signals at the same time.

According to the invention, the optical element arrays and the optical waveguide arrays make it possible to transmit a large number of electric signals between LSIs on the printed circuit board at high speed.

In the photoelectric conversion module for direct optical interconnection according to the invention, the optical element arrays are bonded to side surfaces of the IC board. Therefore, a total of four optical waveguides can be connected to one IC board, which makes it possible to reduce the overall size of an electric circuit system.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:
1. A photoelectric conversion module for direct optical interconnection, the module comprising:
    a printed circuit board (PCB) having an upper surface;
    an Integrated Circuit (IC) board comprising an upper surface, a side surface, and a lower surface attached to the upper surface of said printed circuit board (PCB), and a plurality of via holes passing from said upper surface through said side surface;
    a conductive material filling said plurality of via holes to form a plurality of electrically conductive paths from the upper surface through said side surface;

an optical element array directly bonded to said side surface of the IC board;

an optical waveguide array optically connected to one end of the optical element array having the other end bonded to the IC board; and a semiconductor chip formed on said upper surface of the IC board to operate the optical element array;

wherein the semiconductor chip and the optical element array are electrically connected to each other through the IC board by the conductive material filling said plurality of via holes.

2. The photoelectric conversion module of claim 1, wherein:

a wiring pattern is formed along the side surface of the IC board from the upper surface of the IC board; and the semiconductor chip and the optical element array are electrically connected to each other by the wiring pattern.

3. The photoelectric conversion module of claim 1, wherein:

connection pads are formed on the upper surface of the IC board and the upper surface of the optical element array; and the semiconductor chip and the optical element array are electrically connected to each other by connecting the connection pads with a bonding wire.

4. The photoelectric conversion module of claim 1, wherein the optical element array is bonded to the side surface of the IC board by a flip chip bonding method or a wire bonding method.

5. The photoelectric conversion module of claim 1, wherein the semiconductor chip is bonded to the upper surface of the IC board by a flip chip bonding method or a wire bonding method.

6. The photoelectric conversion module of claim 1, wherein a light transmissive epoxy is interposed between the optical element array and the optical waveguide array to optically connect the optical element array and the optical waveguide array.

7. The photoelectric conversion module of claim 6, wherein the optical element array includes M×N (where M and N are integral numbers) light emitting elements or light receiving elements.

8. The photoelectric conversion module of claim 7, wherein:

the optical waveguide array includes M×N optical waveguides; and the optical waveguides are optically connected to optical elements of the optical element array in one-to-one correspondence with the optical elements.

9. The photoelectric conversion module of claim 6, wherein the light transmissive epoxy has a refractive index of about 1.4 to about 1.6 and about 80 to about 95% transmittance for the wavelength of light emitted from the optical elements.

10. The photoelectric conversion module of claim 1, wherein epoxy is filled between the printed circuit board and the IC board, between the IC board and the semiconductor chip, and between the IC board and the optical element array.

11. A method of manufacturing a photoelectric conversion module for direct optical interconnection, the method comprising:

forming a plurality of via holes in an IC board through an upper surface and passing through a side surface thereof, and filling said plurality of via holes with a conductive material;

bonding a semiconductor chip to an upper surface of said IC board;

bonding an optical element array to said side surface of the IC board;

bonding an optical waveguide array to one end of the optical element array having the other end bonded to the IC board such that the optical waveguide array is optically connected to the optical element array; and bonding the IC board to an upper surface of a printed circuit board, wherein the semiconductor chip and the optical element array are electrically connected to each other through the IC board by the conductive material filling said plurality of via holes; and wherein a light transmissive epoxy is interposed between the optical element array and the optical waveguide array to bond the optical element array and the optical waveguide array.

* * * * *